(12) United States Patent
Nguyen

(10) Patent No.: US 8,432,738 B2
(45) Date of Patent: *Apr. 30, 2013

(54) APPARATUS AND METHOD FOR REDUCED PEAK POWER CONSUMPTION DURING COMMON OPERATION OF MULTI-NAND FLASH MEMORY DEVICES

(75) Inventor: Dzung Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/716,847

(22) Filed: Mar. 3, 2010

(65) Prior Publication Data

US 2010/0157683 A1 Jun. 24, 2010

Related U.S. Application Data

(63) Continuation of application No. 11/436,864, filed on May 17, 2006, now Pat. No. 7,701,764.

(51) Int. Cl.
*G11C 11/34* (2006.01)

(52) U.S. Cl.
USPC ............ 365/185.11; 365/230.06; 365/230.08; 365/230.03

(58) Field of Classification Search ............ 365/185.11, 365/230.06, 230.08, 230.03
See application file for complete search history.

(56) References Cited

U.S. PATENT DOCUMENTS

| | | | | |
|---|---|---|---|---|
| 4,016,542 A | 4/1977 | Azure | ......................... | 340/172.5 |
| 4,030,072 A | 6/1977 | Bjornsson | ................... | 340/172.5 |
| 4,367,531 A | 1/1983 | Furuhashi et al. | ....... | 364/431.08 |
| 4,527,250 A | 7/1985 | Galdun et al. | ................. | 364/900 |
| 4,949,308 A | 8/1990 | Araki et al. | | |
| 5,262,996 A | 11/1993 | Shiue | .............................. | 365/221 |
| 5,341,494 A | 8/1994 | Thayer et al. | .................. | 395/425 |
| 5,430,859 A | 7/1995 | Norman et al. | ................ | 395/425 |
| 5,838,915 A | 11/1998 | Klausmeier et al. | ...... | 395/200.45 |
| 6,134,149 A | 10/2000 | Lin | .......................... | 365/185.29 |
| 6,173,432 B1 * | 1/2001 | Harrison | ........................ | 716/113 |
| 6,240,040 B1 | 5/2001 | Akaogi et al. | ............ | 365/230.06 |
| 6,275,895 B1 | 8/2001 | Tabo | ............................. | 711/106 |
| 6,288,940 B1 | 9/2001 | Kawamura | ............... | 365/185.09 |
| 6,614,685 B2 | 9/2003 | Wong | ....................... | 365/185.11 |
| 6,661,721 B2 * | 12/2003 | Lehmann et al. | ............. | 365/203 |
| 6,883,061 B2 | 4/2005 | Seo et al. | ....................... | 711/106 |

(Continued)

FOREIGN PATENT DOCUMENTS

JP 2003-233994 8/2003
JP 2004-288267 10/2004

OTHER PUBLICATIONS

Office Action dated Jun. 30, 2010 for Korean Application No. 10-2008-7030242, 6 pgs.

(Continued)

*Primary Examiner* — Fernando Hidalgo
(74) *Attorney, Agent, or Firm* — Dorsey & Whitney LLP

(57) ABSTRACT

System and method for executing a global memory command in a multi-chip non-volatile memory device having a plurality of non-volatile memories. The global memory command is received at each non-volatile memory concurrently. The memory command is initiated at different times relative to receiving the global memory command for at least two of the plurality of non-volatile memory to mitigate peak power consumption.

16 Claims, 4 Drawing Sheets

U.S. PATENT DOCUMENTS

| | | |
|---|---|---|
| 7,116,603 B2 | 10/2006 | Kanda et al. |
| 2003/0093702 A1 | 5/2003 | Luo et al. ............... 713/320 |
| 2003/0142571 A1 | 7/2003 | Kanda et al. |
| 2004/0148482 A1* | 7/2004 | Grundy et al. ........... 711/167 |
| 2005/0007835 A1* | 1/2005 | Lee et al. ............. 365/189.12 |
| 2005/0082579 A1 | 4/2005 | Horii et al. ............... 257/222 |
| 2005/0149780 A1 | 7/2005 | Avraham ................. 714/718 |
| 2007/0011518 A1* | 1/2007 | Ung et al. ................ 714/724 |
| 2007/0279988 A1 | 12/2007 | Nguyen ............... 365/185.18 |

OTHER PUBLICATIONS

International Search Report and Written Opinion dated Jun. 5, 2008 for PCT Application No. PCT/US2007/66531.

Office Action dated Jul. 26, 2011 for China Application No. 200780021411.7.

Office Action dated Aug. 30, 2011 for Japanese Application No. 2009-511133.

Office Action dated Mar. 27, 2012 for Japanese Patent Application No. 2009-511133, Mar. 27, 2012, 1-4.

Second Office Action for Chinese Patent Application No. 200780021411.7, Feb. 29, 2012, 1.

EP Extended European Search Report dated Jul. 13, 2009 for EP Application No. 07760564.0.

EP Office Action dated Oct. 30, 2009 for EP Application No. 07760564.0.

KR Office Action dated Jun. 30, 2010 for KR Application No. Oct. 2008-7030242.

\* cited by examiner

APPARATUS AND METHOD FOR REDUCED PEAK POWER CONSUMPTION DURING COMMON OPERATION OF MULTI-NAND FLASH MEMORY DEVICES

CROSS-REFERENCE TO RELATED APPLICATION

This application is a continuation of pending U.S. patent application Ser. No. 11/436,864, filed May 17, 2006. This application is incorporated by reference herein.

TECHNICAL FIELD

The invention relates generally to multi-chip non-volatile memory, and more particularly, to reducing peak power consumption during execution of a memory command issued to NAND flash memories of a multi-chip NAND flash memory device.

BACKGROUND OF THE INVENTION

Non-volatile memory is memory that can continue to store data after power is no longer provided to the memory. "Flash memory," called this because data can be erased from multiple memory cells simultaneously, is an example of non-volatile memory. A typical flash memory comprises an array of memory cells having the cells arranged in rows and columns of memory. The array is broken down into blocks of memory cells. Although each of the cells within a block can be electrically programmed to store data individually, data is erased from the cells at the block level.

A common example of flash memory is NAND flash memory. The array of memory cells for NAND flash memory devices are arranged such that a control gate of each memory cell of a row of the array is connected to a word line. However, each memory cell is not directly connected to a column bit line. Instead, the memory cells of the array are arranged together in strings ("NAND strings"), with the memory cells connected together in series, source to drain, between a source line and a column bit line. The NAND strings can have as many as 32 memory cells between the source line and the column bit line.

The memory array for NAND flash memory devices is then accessed by a row decoder activating a row of memory cells by selecting the word line connecting the control gates of the memory cells. In addition, the word lines connected to the control gates of unselected memory cells of each string are driven so that the respective memory cell passes current in a manner that is unrestricted by their stored data values. Current then flows from the source line to the column bit line through each series connected string, restricted only by the selected memory cells of each string. This places the current-encoded data values of the row of selected memory cells on the column bit lines to be sensed and amplified before being output as data, as well known.

In an effort to provide greater memory density in a relatively small package, multiple NAND flash memories are packaged together as one device to provide a multi-chip NAND flash memory device. In some arrangements, the NAND flash memories share common circuits and busses so that from all outward appearances, the multiple NAND flash memories are controlled and operated as a single, larger capacity NAND flash memory device. As a result, memory commands issued to the multi-chip memory device may be executed by one or some of the NAND flash memories, while other memory commands issued to the multi-chip memory are executed by all of the NAND flash memories. The latter type of memory commands are often referred to as global memory commands, which cause common operation of all or a substantial number of the discrete NAND flash memories at one time.

An example of a global memory command is a reset command, which can be used to abort a command sequence in progress and put the individual NAND flash memories in a known condition. Thus, when a global reset command is issued to a multi-chip NAND flash memory device, all of the individual NAND flash memories in the multi-chip memory respond by executing the reset command.

A result of issuing a global memory command to a multi-chip device is that there is a sudden increase in its power consumption due to multiple devices beginning execution on the memory command. For example, the global memory command may require that on-board charge pumps be activated and provide elevated voltages for carrying out the command. The sudden increase places a significant load on the power supply providing power to the multi-chip device. In cases where the power supply has insufficient capacity, the voltage and current may dip, affecting not only the performance of the multi-chip device, but other electrical devices that rely on the same power supply. In battery powered applications, sudden increases in power consumption are undesirable because of the power supply's limited availability to handle peak power demands as well as limited overall availability of power.

Therefore, there is a need for a system and method that mitigates the peak power demand that occurs in response to issuing a global command to a multi-chip device.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
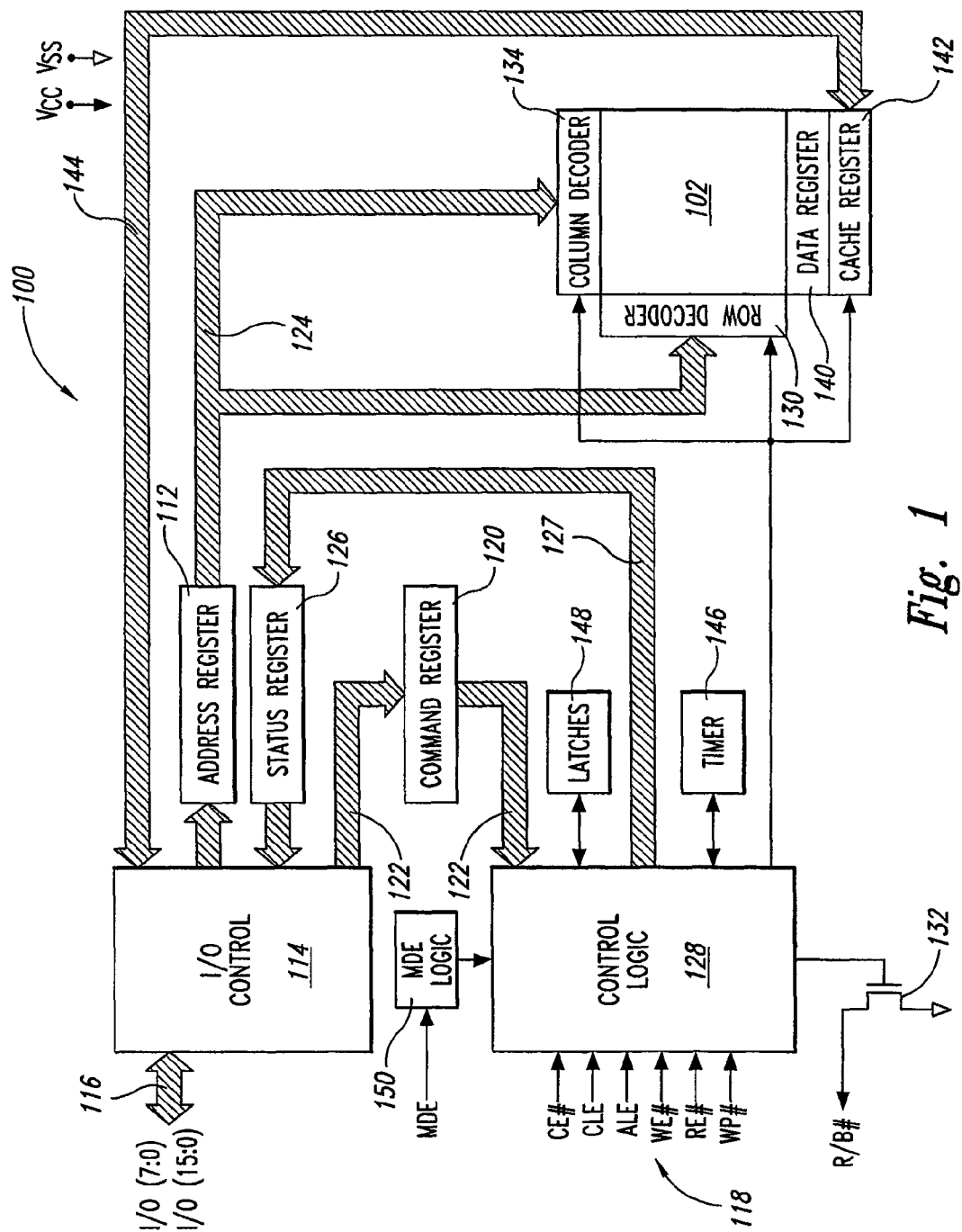
FIG. 1 is a simplified block diagram of a NAND flash memory in which embodiments of the present invention can be implemented.

FIG. 1 is a simplified block diagram of a portion of a NAND flash memory 100 according to an embodiment of the present invention. As shown in FIG. 1, the memory 100 has been simplified to focus on features of the memory that are helpful in understanding the present invention. A more detailed understanding of internal circuitry and functions of flash memories are known to those skilled in the art. The memory 100 includes a memory array 102 having a plurality of memory cells arranged in row and column fashion. Each of the memory cells includes a floating-gate field-effect transistor capable of holding a charge for the non-volatile storage of data. Each of the cells can be electrically programmed on an individual basis by charging the floating gate. The rows of memory array 102 are arranged in blocks, where a memory block is some discrete portion of the memory array 102. The memory cells generally can be erased in blocks. Data, however, may be stored in the memory array 102 in finer increments than a memory block. Row decoder and column decoder circuits 130, 134 decode memory addresses to access the corresponding memory locations in the memory array 102. Data register 140 and optional cache register 142 temporarily store data read from, or to be written to the memory array 102.

Command, data and address signals are provided to an I/O control 114 on device bus 116, which is multiplexed for receiving the various signals. Which of the various signals are being received is determined by control signals 118 provided to control logic 128. In response to control signals 118 indicating that command signals are being provided on the device bus 116 to the I/O control 114, the command signals are received by the I/O control 114 and the corresponding commands are latched by a command register 120. The latched command is provided to the control logic 128 via internal command bus 122, where commands are decoded and corresponding internal control signals are generated by the control logic 128 to perform the requested commands. In response to the control signals 118 indicating that address signals are being provided on the device bus 116 to the I/O control 114, the address signals are received and the corresponding addresses are latched in an address register 112. A status register 126 is used to latch status information provided to it over an internal status bus 127 from the control logic 128. The status information is generated by the control logic 128 in response to receiving a command requesting the status of an operation.

The control logic 128 is coupled to a transistor 132 to provide a ready/busy signal R/B# that can be used for indicating the completion of various memory operations. The signal is typically HIGH, and transitions to LOW after a command is written to the device. When the current memory operation is completed, the R/B# signal transitions back to HIGH.

A timer 146 coupled to the control logic 128 can be used for timing a time delay. As will described in more detail below, the timer 146 can be used for staggering execution of a global memory command by the individual NAND flash memories of a multi-chip NAND flash memory to avoid having all of the NAND flash memories begin initiating the global memory command at one time. The timer 146 is conventional and can be implemented using well known circuits and designs. The control logic 128 is further coupled to multi-die enable (MDE) logic 150. The MDE logic receives an MDE signal that is used to identify the NAND flash memory 100 for multi-chip applications. For example, in a multi-chip application having two NAND flash memories, the input to the MDE logic 150 for one of the memory can be coupled to a supply voltage VCC and the input to the MDE logic 150 for the other memory can be coupled to ground VSS. Based on the signal applied to the MDE logic 150, the control logic 128 is provided with identification information for the NAND flash memory. Where a greater number of NAND flash memories are used, the MDE logic can be modified to receive more signals so that each of the memories can be uniquely identified, as known in the art.

Latches 148 coupled to the control logic 128 are used for storing various information regarding the state of the NAND flash memory 100. Each of the latches included in the latches 148 can be set by the control logic 128 to a first state or a second state. Based on the state of the latch, the control logic 128 can determine a mode of operation of the memory (e.g., set to the first state to indicate a first mode of operation and set to the second state to indicate a second mode of operation) or whether an event has occurred (e.g., set to the first state upon initial power-up of the memory 100 and set to a second state after the event has occurred). The latches 148 are conventional, and can be designed and operated as well known to those ordinarily skilled in the art.

In operation, the memory array 102 can be accessed by providing a combination of control, command, and address signals. For example, to perform a read operation, a first combination of control signals 118 is provided to the control logic 128 to indicate that command signals are applied to the device bus 116. The control logic 128 generates internal control signals for the I/O control 114 to receive the command signals and for the corresponding command to be latched in the command register 128. The control logic 128 decodes the read command and begins to generate internal control signals for accessing the memory array 102.

A second combination of control signals 118 is provided to the control logic 128 to indicate that address signals are applied to the device bus 116. The control logic generates internal control signals for the I/O control 114 to receive the address signals and for the corresponding addresses to be latched in the address register 112. The addresses are provided to a row decoder circuit 130 and a column decoder circuit 134 via an internal address bus 124 for decoding the addresses and accessing the memory locations corresponding to the latched addresses.

A page of memory cells having the memory locations to be accessed is read from the memory array 102 and stored in a data register 140. The data from the page of memory is transferred to a secondary (and optional) cache register 142 before being provided to the I/O control 114 on an internal data bus 144. The cache register can be used to temporarily store the page of data in order to free the data register 140 to store another page of data for a subsequent access operation of the memory array 102. The page of data is transferred to the I/O control 114 from the cache register 142. Based on the addresses, the appropriate data from the page of data is output on the device bus 116.

A write operation occurs in a similar manner except that following the second combination of control signals a third combination of control signals are provided to the control logic 128 indicating that data to be written to the memory locations corresponding to the addresses is being provided on the device bus 116. The data received by the I/O control 114 is provided on the internal data bus 144 to the cache register 142 for writing to the memory array 102.

Figure 2:
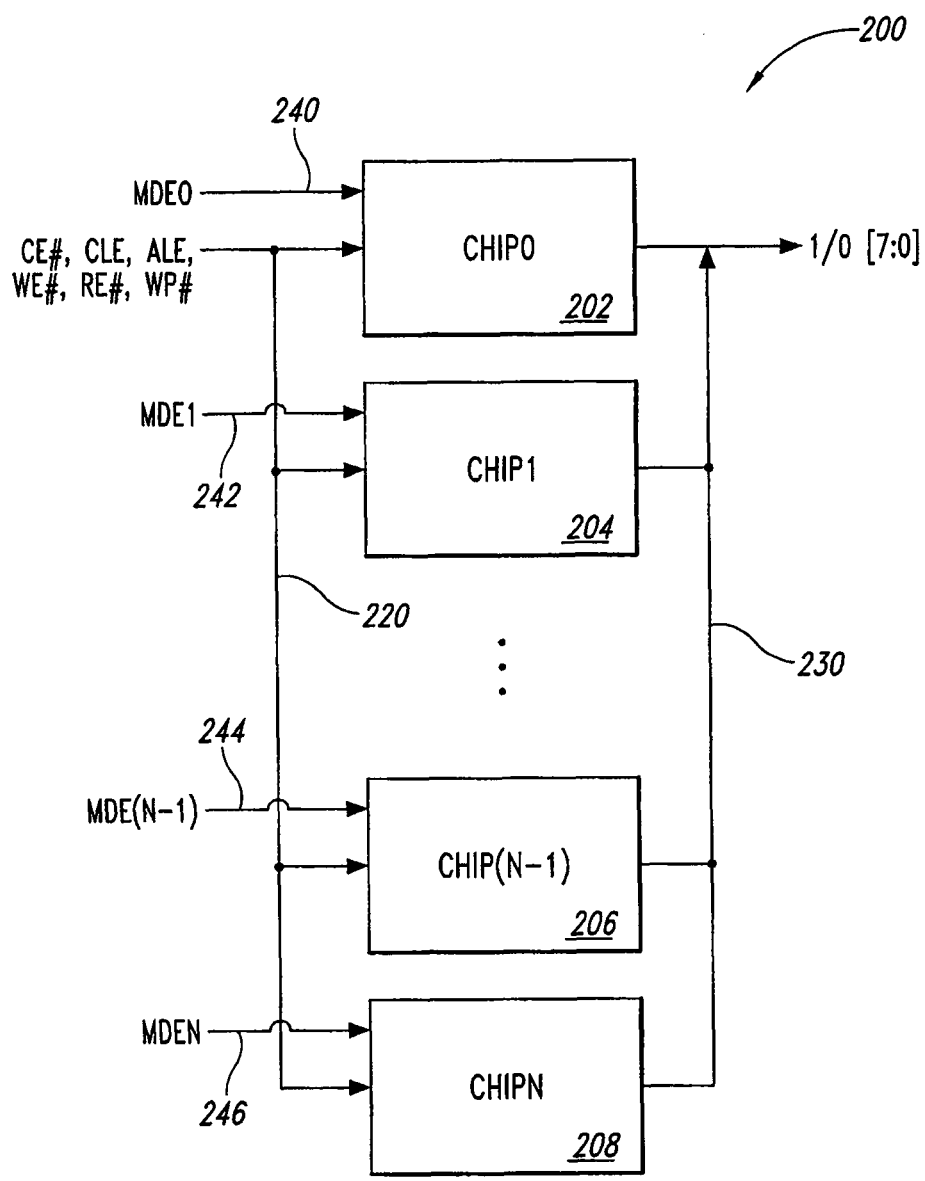
FIG. 2 is a simplified block diagram of a multi-chip NAND flash memory having a plurality of NAND flash memories as shown in FIG. 1.

FIG. 2 illustrates a multi-chip NAND flash memory 200. The multi-chip memory 200 includes N separate NAND flash memories 202-208 sharing a control bus 220 and an input-output (I/O) bus 230. The NAND flash memories 202-208 are typically included in a single device package to provide high-density, small form factor, multi-chip memory.

Each of the NAND flash memories 202-208 are conventionally programmed or have the respective MDE logic 150 electrically connected to have unique identification information. In alternative embodiments, non-volatile chip identification latches included in the latches 148 are programmed with the identification information. As shown in FIG. 2, the first NAND flash memory 202 is identified as Chip0 and the second NAND flash memory 204 is identified as Chip1. The remaining NAND flash memories are identified by an increasing chip number, with the last two devices 206 and 208 identified as Chip(N−1) and ChipN, respectively.

An external memory controller (not shown) provides combinations of control signals over the control bus 220, and command, address and data signals over the I/O bus 230 to perform various memory operations. The control bus 220 includes signal lines for providing various control signals to each device. Examples of control signals are CE#, CLE, ALE, WE#, RE#, and WP#, as known. In the embodiment shown in FIG. 2, separate MDE signals are provided to the NAND flash memories 202-208 on MDE terminals 240, 242, 244, and 246, respectively, for setting the identification information for each of the respective NAND flash memories 202-208. The I/O bus 230 includes multiple signal lines and is shown as an eight-bit wide bus I/O[7:0]. I/O busses of different bit-widths can be used as well.

In operation, control, command, address, and data signals are provided to all of the NAND flash memories 202-208 on the control and I/O busses 220, 230. However, only those memories that are activated by the respective CE# signal will receive and respond to the signals.

As previously discussed, a global memory command can be issued from the memory controller by activating all of the NAND flash memories 202-208 and providing the appropriate control and command signals on the control and I/O busses 220, 230. Conventionally, each of the NAND flash memories 202-208 begins executing the memory command simultaneously, which as also previously discussed, can place significant peak power demands on a power supply (not shown) coupled to the multi-chip memory 200. This situation is particularly undesirable in applications where power is provided by a battery or another limited source of power.

Figure 3:
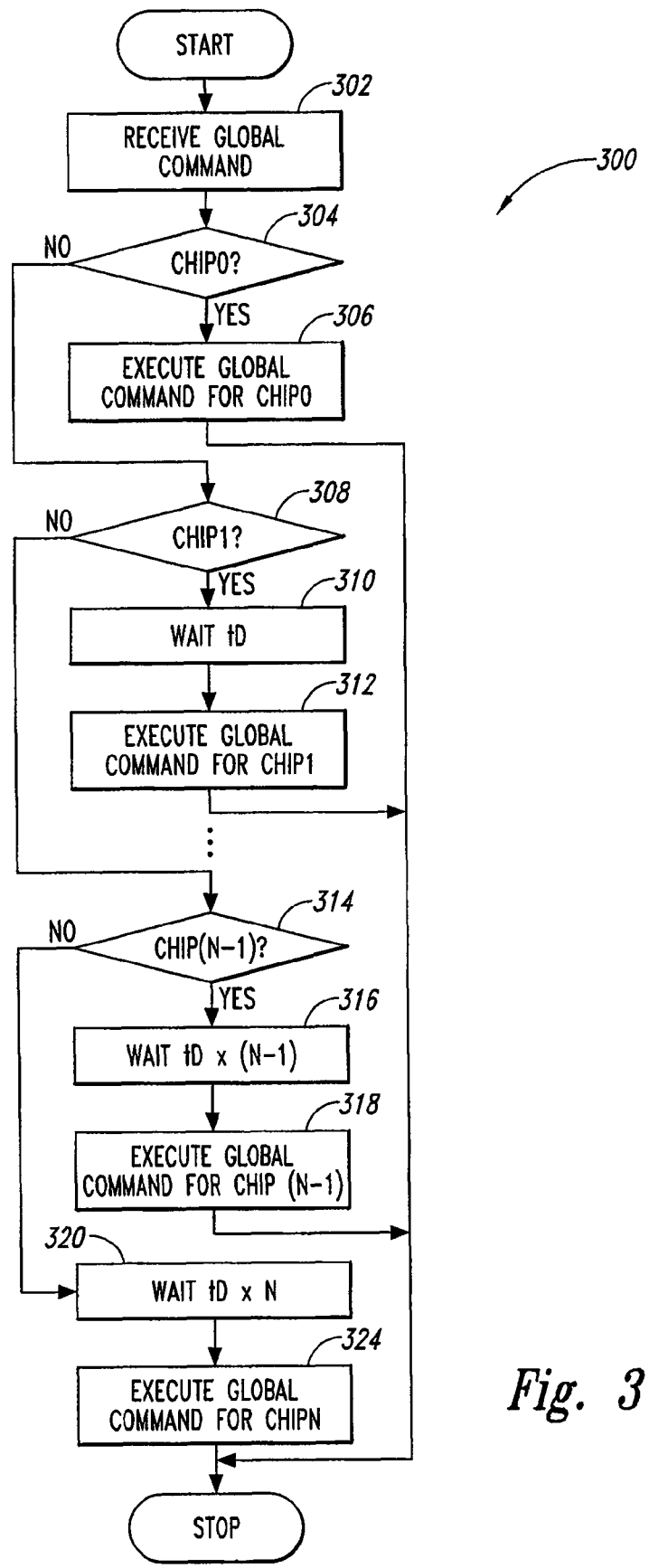
FIG. 3 is a flow diagram for executing according to and embodiment of the present invention a global memory command issued to a multi-chip NAND memory.

FIG. 3 is a flow diagram illustrating a routine 300 for executing according to an embodiment of the present invention a global memory command issued to the NAND flash memories 202-208 (FIG. 2). The routine 300 is concurrently performed by the control logic 128 of each of the NAND flash memories 202-208 in response to receiving a global command. Generally, executing the routine 300 by all of the NAND flash memories 202-208 results in sequentially initiating the global memory command issued to all of the NAND flash memories 202-208 at step 302. In this manner, peak power consumption can be reduced by delaying the time at which each memory 202-208 begins executing the global memory command in response to receiving the global memory command, thereby mitigating the demand on a power supply providing power to the multi-chip NAND flash memory 200. An example of a global memory command is a reset command (FFh) that is issued to all of the NAND flash memories 202-208 to abort a command sequence in progress, clear the command register 120, and put the NAND flash memories 202-208 into a known condition. Other memory commands that can be issued globally to the NAND flash memories 202-208 are known in the art and can be executed according to an embodiment of the present invention. Embodiments of the present invention are not intended to be limited to any particular global memory command, except as recited in the appended claims.

At step 302, each of the NAND flash memories 202-208 receives a global memory command. In response to receiving the global memory command, the NAND flash memories 202-208 perform the routine illustrated in FIG. 3. The query at step 304 will be affirmative for only the NAND flash memory 202, while the remaining NAND flash memories 204-208 proceed to step 308. From step 304, the NAND flash memory 202 executes the global memory command at step 306 and upon completion of the global memory command, the memory 202 exits from the routine 300.

During the time the NAND flash memory 202 is executing the global memory command, the NAND flash memories 204-208 continue through the routine 300. At step 308, the query will be affirmative for only the NAND flash memory 204, while the remaining NAND flash memories 206-208 continue to step 314. The NAND flash memory 204 begins measuring a time delay tD using the timer 146. When the delay tD elapses, the NAND flash memory 204 executes the global memory command at step 312. At the completion of the global memory command, the NAND flash memory 204 exits from the routine 300. During the time delay tD, the remaining NAND flash memories 206-208 continue through the routine 300 to determine how much time delay to wait before executing the global memory command.

For the second to the last NAND flash memory 206, the query at step 314 is affirmative, and the memory 206 begins waiting a time delay of tD×(N−1) before executing the global memory command. The last NAND flash memory 208, by default begins waiting a time delay of tD×N before executing the global memory command.

In the embodiment illustrated in FIG. 3, each of the NAND flash memories 202-208 waits a respective time delay before beginning to execute the global memory command originally received at step 302. The respective time delay for the process 300 is a multiple of time delay tD, with each succeeding NAND flash memory 202-208 having a greater time delay. As a result, the NAND flash memories 202-208 do not all begin executing the global memory command at the same time, but rather, execution of the global memory command by each NAND flash memory 202-208 is staggered by a time delay of tD so that peak power consumption is reduced compared to having all the NAND flash memories 202-208 beginning execution of the global memory command at the same time.

The respective delay times at which the NAND flash memories 202-208 begin executing the global memory command can be selected to provide overlapping execution of the global memory command or provide sequential non-overlapping execution of the global memory command. For example, where the global memory command takes 30 us to complete, and overlapping execution is desired, the NAND flash memories 202-208 can be staggered to begin executing the global memory command every 15 us so that the global memory command is being concurrently executed by two NAND flash memories, or as will described in more detail below, two groups of NAND flash memories, at any one time. Another example for overlapping execution of the global memory command is to stagger execution by 10 us so that three NAND flash memories or groups of memories are executing the global memory command at any one time.

In the case where sequential non-overlapping execution is desired, execution by the NAND flash memories 202-208 or groups of memories can be staggered to begin at 30 us or greater. In this manner, no more than one NAND flash memories is executing the global memory command at any one time.

In embodiments of the present invention, the time delay between when succeeding NAND flash memories or groups of NAND flash memories begin executing the global memory command can be the same or different. For example, in the process 300 illustrated in FIG. 3, the time delay between succeeding NAND flash memories is the same, that is, time delay tD. However, in another embodiment, the time between when the NAND flash memories 202 and 204 begin executing the global memory command can be tD, while the time delay until the next NAND flash memory or memories begin executing the global memory command can be greater or less than tD.

Although the global memory command in the process 300 is initiated by each NAND flash memory 202-208 after waiting a respective time delay, in other embodiments of the present invention, groups of the NAND flash memories 202-208 can begin executing the global memory command at the same time. For example, both the NAND flash memories 202 and 204 can begin executing the global memory command at a first time, then another pair of the remaining NAND flash memories can begin executing the global memory command at a second time after the first time. The process continues with pairs of NAND flash memories beginning execution of the global command at increasingly later times until the last two NAND flash memories 206 and 208 execute the global memory command.

Figure 4:
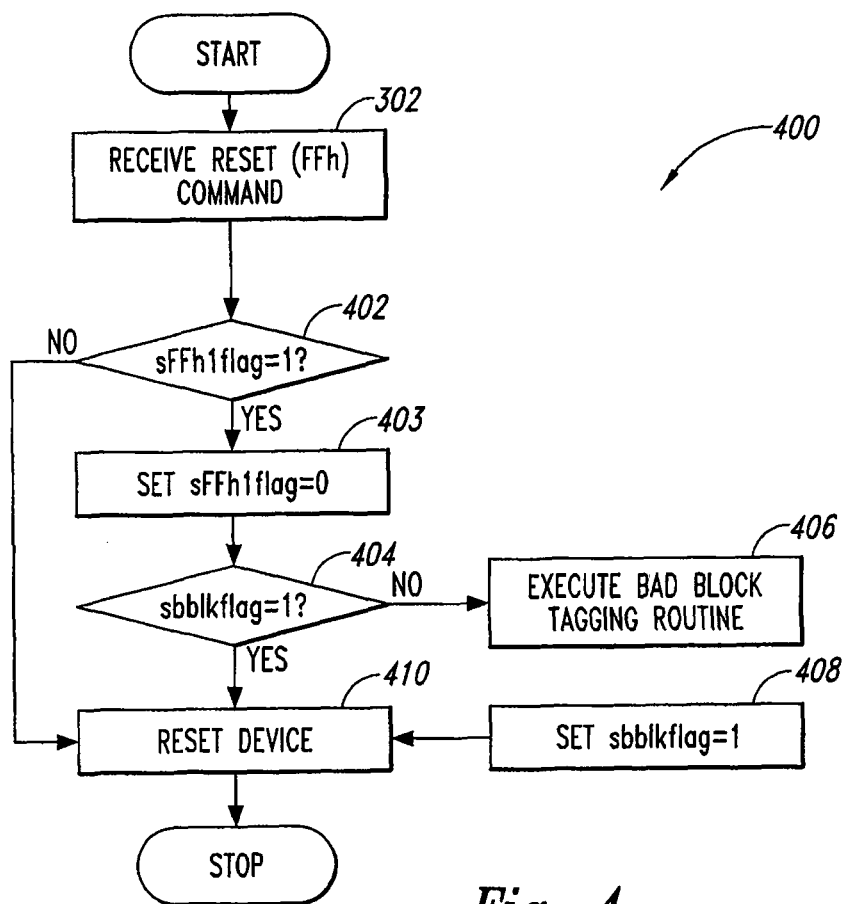
FIG. 4 is a flow diagram for executing a first idle reset command that can be issued globally and executed as shown in FIG. 3.

FIG. 4 is a flow diagram for global first idle reset command 400 that is executed by the control logic 128 (FIG. 1). The global first idle reset command 400 is an example of a global memory command that can be substituted into steps 306, 312, 318, and 324 (FIG. 3). Generally, as previously discussed, a reset command can be used to put the memory into a known condition and to abort a command sequence in process. For example, read, program, and erase commands can be aborted while the device is executing the command. Additionally, the command register is cleared and is ready for a next command.

In the reset command 400, a bad block tagging routine is performed by the NAND flash memories 202-208 if the reset command is the first reset after the memory is powered-up and the bad block tagging routine for the respective NAND flash memory has not yet been performed. The bad block tagging routine is performed to disable access to blocks of memory in the memory array 102 that are defective, or that include defective memory cells. Bad block tagging routines now known or later developed can be used for step 406 (FIG. 4). In the case where the reset command is not the first one issued, or is the first one issued but the bad block tagging routine has already been performed, the NAND flash memory is only reset.

As known, NAND flash memory is designed to serve as a low cost solid state mass storage medium. As a result, standard specifications for NAND flash memory allow a manufacturer to sell NAND flash devices having a percentage of non-functional blocks of memory, or "initial bad blocks" of memory. Allowing for bad blocks of memory increases the effective yield of marketable devices, thereby lowering costs. The bad blocks do not affect the performance of good blocks of memory because each block is independently accessible. As a result of allowing for the presence of bad blocks of memory, the initial bad blocks need to be identified and disabled before use of the memory.

Generally the process of identifying initial bad blocks occurs during testing by the manufacturer. A conventional manner of marking the bad blocks is to program non-FF data at specific locations within each bad block. Another technique for marking bad blocks is programming initial bad block information into specific circuits designed to store this information or into memory locations in the memory array 102. Upon use by a user, a bad block tagging routine is performed by the control logic 128 where all blocks identified by the non-FF data or bad block information are disabled from access.

The first idle reset command 400 will be described with reference to the NAND flash memory 202. Execution of the first idle reset command 400 is the same in the other NAND flash memories 204-208, and consequently, the following description for the NAND flash memory 202 can be applied to those memories.

Assuming that a reset command (FFh) is issued to all of the NAND flash memories 202-208 at step 302, the NAND flash memory 202 begins executing the reset command at step 306 (FIG. 3). Execution of the reset command begins at step 402 with the control logic 128 checking a first FFh reset latch included with the latches 148 to determine whether a first FFh reset command flag sFFh1flag is set (i.e., sFFh1flag=1). Although not shown in FIG. 4, the sFFh1flag for each memory 202-208 is set upon initial power-up. The effect of the query at step 402 is to determine whether the reset command received at step 302 is the first reset command following initial power-up of the multi-chip NAND flash memory 200. Assuming that this is the case, the control logic 128 of the NAND flash memory 202 sets the sFFh1flag (i.e., the first FFh reset latch) to zero at step 403 so that any subsequent reset command will cause only a reset operation to occur.

At step 404, the control logic 128 checks a bad block tagging latch also included with the latches 148 to determine whether a bad block tagging flag sbblkflag is set (i.e., sbblkflag=1). A set sbblkflag is indicative of the bad block tagging routine having been performed. Upon power-up of the memory, the sbblkflag is reset to zero. In the present example, where it is assumed that the global reset command is the first one issued following power-up, the sbblkflag is not set, and consequently, the NAND flash memory 202 executes a bad block tagging routine at step 406. As previously discussed, a conventional bad block tagging routine known in the art can be performed at step 406. After the bad block tagging routine has been initiated, the sbblkflag (i.e., the bad block tagging latch) is set to one to indicate that the routine has already been performed. At step 410, the NAND flash memory 202 is reset to clear the command register 120 and place the NAND flash memory 202 into a known condition.

As previously discussed, the first idle reset command 400 is performed by all of the NAND flash memories 202-208 in response to issuing the command globally at step 302. The process 300, previously described with reference to FIG. 3, dictates the relative timing of when each memory 202-208 begins executing the first idle reset command 400. For subsequent reset commands (i.e., sFFh1flag=0), the NAND flash memories 202-208 are reset without executing a bad block tagging routine. However, the timing of the reset operations are still staggered by a time of tD.

Figure 5:
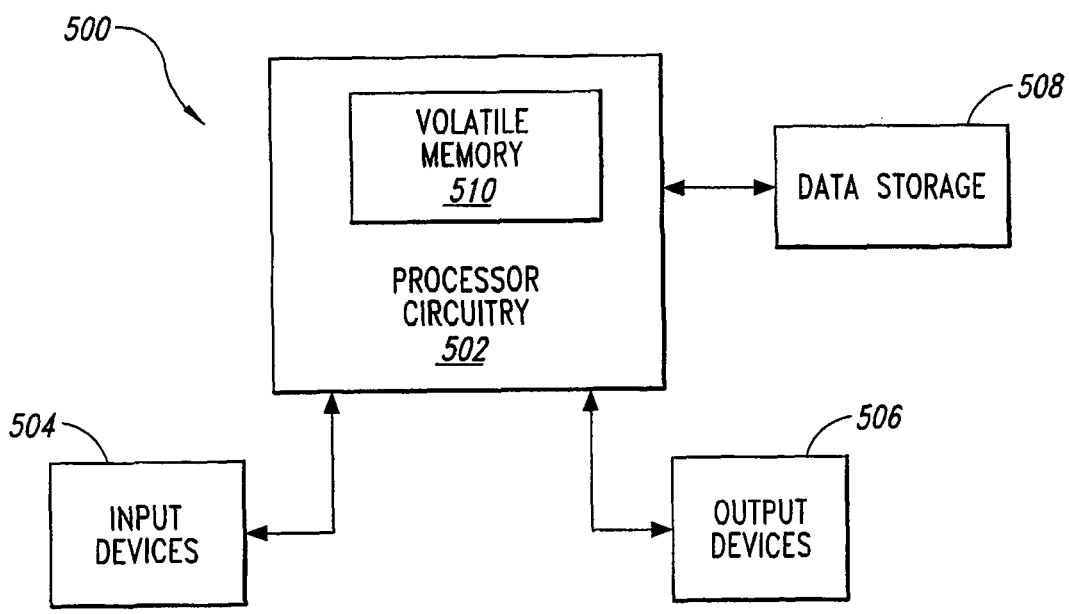
FIG. 5 is a simplified block diagram of a system including non-volatile data storage according to an embodiment of the present invention.

FIG. 5 is a block diagram of a processor-based system 500 including processor circuitry 502 having volatile memory 510. The processor circuitry 502 is coupled through address, data, and control buses to the volatile memory 510 to provide for writing data to and reading data from the volatile memory 510. The processor circuitry 502 includes circuitry for performing various processing functions, such as executing specific software to perform specific calculations or tasks. The processor-based system 500 also includes one or more input devices 504 coupled to the processor circuitry 502 to allow an operator to interface with the processor-based system 500. Examples of input devices 504 include keypads, touch screens, and scroll wheels. The processor-based system 500 also includes one or more output devices 506 coupled to the processor circuitry 502 to provide output information to the operator. In one embodiment, the output device 506 is a visual display providing visual information to the operator. Data storage 508 is also coupled to the processor circuitry 502 to store data that is to be retained even when power is not supplied to the processor-based system 500 or to the data storage 508. The NAND flash memory 100, or another embodiment of a NAND flash memory according to the present invention, can be used for the data storage 508.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for executing a memory command, the method comprising:
   substantially concurrently receiving the memory command at a plurality of non-volatile memories, wherein each of the plurality of non-volatile memories is associated with a respective different identification number; and
   delaying execution of the memory command by each of the plurality of non-volatile memories by a respective different amount from a time the memory command is received, wherein each respective different amount is based, at least in part, on the respective different identification number.

2. The method according to claim 1, wherein each respective different amount is provided by the respective non-volatile memory.

3. The method according to claim 1, further comprising executing the memory command by each of the plurality of non-volatile memories following a delay of the respective different amount from the time the memory command is received.

4. The method according to claim 3, wherein the execution of the memory command by one of the plurality of non-volatile memories at least partially overlaps the execution of the memory command by at least another of the plurality of non-volatile memories.

5. The method according to claim 3, wherein the execution of the memory command by one of the plurality of non-volatile memories occurs after execution of the memory command by at least another of the plurality of non-volatile memories is complete.

6. The method according to claim 3, further comprising:
   substantially concurrently receiving the memory command at an additional non-volatile memory; and
   initiating execution of the memory command by the additional non-volatile memory at substantially a same time as the execution of the memory command by one of the plurality of non-volatile memories.

7. The method according to claim 3, wherein a first delay between the initiation of the execution of the memory command by a first of the plurality of non-volatile memories and a second of the plurality of non-volatile memories is the same as a second delay between the initiation of the execution of the memory command by the second of the plurality of non-volatile memories and a third of the plurality of non-volatile memories.

8. The method according to claim 3, wherein a first delay between the initiation of the execution of the memory command by a first of the plurality of non-volatile memories and a second of the plurality of non-volatile memories is different than a second delay between the initiation of the execution of the memory command by the second of the plurality of non-volatile memories and a third of the plurality of non-volatile memories.

9. The method according to claim 2, wherein the respective different identification numbers are each stored within the associated non-volatile memory.

10. A system comprising:
    a memory controller configured to issue a memory command;
    a bus coupled to the memory controller;
    a plurality of non-volatile memories coupled to the bus, wherein the bus is configured to provide the memory command to each of the plurality of non-volatile memories substantially simultaneously, and wherein each of the plurality of non-volatile memories is associated with a respective identification number, each of the non-volatile memories comprises:
       a register configured to store the memory command; and
       control logic coupled to the register and configured to initiate execution of the memory command following a respective different time delay from receipt of the memory command each respective different time delay is based, at least in part, on the respective different identification number.

11. The system according to claim 10, wherein each of the non-volatile memories provides the respective different time delay.

12. The system according to claim 10, further comprising:
    a processor coupled to the memory controller; and
    an output device coupled to the processor.

13. The system according to claim 10, wherein the control logic of at least two of the plurality of non-volatile memories are configured to initiate execution of the memory command at different times such that execution of the memory command by one of the plurality of non-volatile memories at least partially overlaps execution of the memory command by one of the two non-volatile memories.

14. The system according to claim 10, wherein the control logic of at least two of the plurality of non-volatile memories are configured to initiate execution of the memory command at different times such that execution of the memory command by one of the two non-volatile memories occurs after execution of the memory command by the other of the two non-volatile memories is complete.

15. The system according to claim 10, wherein a first delay between the initiation of the execution of the memory command by a first of the plurality of non-volatile memories and a second of the plurality of non-volatile memories is the same as a second delay between the initiation of the execution of the memory command by the second of the plurality of non-volatile memories and a third of the plurality of non-volatile memories.

16. The system according to claim 10, wherein a first delay between the initiation of the execution of the memory command by a first of the plurality of non-volatile memories and a second of the plurality of non-volatile memories is different than a second delay between the initiation of the execution of the memory command by the second of the plurality of non-volatile memories and a third of the plurality of non-volatile memories.

\* \* \* \* \*

UNITED STATES PATENT AND TRADEMARK OFFICE
CERTIFICATE OF CORRECTION

PATENT NO. : 8,432,738 B2
APPLICATION NO. : 12/716847
DATED : April 30, 2013
INVENTOR(S) : Dzung Nguyen It is certified that error appears in the above-identified patent and that said Letters Patent is hereby corrected as shown below:

In the Claims:

In column 10, line 5, in Claim 9, delete "claim 2," and insert -- claim 1, --, therefor.

Signed and Sealed this
Twenty-fifth Day of June, 2013

Teresa Stanek Rea
*Acting Director of the United States Patent and Trademark Office*